(12) United States Patent
Chou et al.

(10) Patent No.: US 9,966,963 B2
(45) Date of Patent: May 8, 2018

(54) FREQUENCY SYNTHESIZER

(71) Applicant: Taiwan Semiconductor Manufacturing Company Limited, Hsinchu (TW)

(72) Inventors: Mao-Hsuan Chou, Hsinchu County (TW); Chih-Chiang Chang, Taipei (TW); Chung-Chieh Yang, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 57 days.

(21) Appl. No.: 15/273,746

(22) Filed: Sep. 23, 2016

(65) Prior Publication Data
US 2018/0091161 A1    Mar. 29, 2018

(51) Int. Cl.
| H03K 21/00 | (2006.01) |
| H03K 23/00 | (2006.01) |
| H03K 25/00 | (2006.01) |
| H03L 7/099 | (2006.01) |
| H03L 7/181 | (2006.01) |

(52) U.S. Cl.
CPC .......... *H03L 7/0991* (2013.01); *H03L 7/181* (2013.01); *H03L 2207/50* (2013.01)

(58) Field of Classification Search
CPC .. H03K 23/68; H03K 23/667; H03K 5/00006; G06F 7/68; G06F 1/08
USPC .......................... 327/115, 105, 159
See application file for complete search history.

(56) References Cited

U.S. PATENT DOCUMENTS

| 5,121,417 A | * | 6/1992 | Swierczek | ................ | G06F 1/04 331/18 |
| 2011/0234265 A1 | * | 9/2011 | Huang | ...................... | G06F 1/08 327/115 |
| 2014/0176201 A1 | * | 6/2014 | Weltin-Wu | ............ | H03K 5/131 327/115 |
| 2014/0327473 A1 | * | 11/2014 | Muhammad | ......... | H03K 21/023 327/117 |

* cited by examiner

*Primary Examiner* — Quan Tra
(74) *Attorney, Agent, or Firm* — Jones Day (57) ABSTRACT

A frequency synthesizer comprising a reference oscillator configured to generate a first clock signal with a reference frequency and a divider controller configured to receive the first clock signal, a second clock signal, and a multiplier value. The divider controller is configured to obtain a ratio of a frequency of the first clock signal to a frequency of the second clock signal and divide the resulting ratio by the multiplier value to obtain controller output value. A divider is configured to receive the first clock signal and controller output value and output an output clock signal with a frequency equal to the frequency of the first clock signal divided by the controller output value.

20 Claims, 10 Drawing Sheets

| Fin (MHz) | Fro (MHz) | TARGET Fout (MHz) | N | M | N/M | ROUND (N/M) | ACTUAL Fout (MHz) | FREQUENCY ERROR |
|---|---|---|---|---|---|---|---|---|
| 10 | 5000 | 250 | 500 | 25 | 20.0 | 20 | 250 | 0.0% |
| 10 | 5000 | 260 | 500 | 26 | 19.2 | 19 | 263.16 | -1.2% |
| 10 | 5000 | 270 | 500 | 27 | 18.5 | 19 | 263.16 | 2.6% |
| 10 | 5000 | 280 | 500 | 28 | 17.9 | 18 | 277.78 | 0.8% |
| 10 | 5000 | 290 | 500 | 29 | 17.2 | 17 | 294.12 | -1.4% |
| 10 | 5000 | 300 | 500 | 30 | 16.7 | 17 | 294.12 | 2.0% |

| Fin (MHz) | Fdco (MHz) | TARGET Fout (MHz) | N | M | N/M | ROUND (N/M) | ACTUAL Fout (MHz) | FREQUENCY ERROR |
|---|---|---|---|---|---|---|---|---|
| 10 | 5000 | 200 | 500 | 20 | 25.0 | 25 | 200 | 0.0% |
| 10 | 5040 | 210 | 504 | 21 | 24.0 | 24 | 210.00 | 0.0% |
| 10 | 5040 | 220 | 504 | 22 | 22.9 | 23 | 219.13 | 0.4% |
| 10 | 5040 | 230 | 504 | 23 | 21.9 | 22 | 229.09 | 0.4% |
| 10 | 5040 | 240 | 504 | 24 | 21.0 | 21 | 240.00 | 0.0% |
| 10 | 5000 | 250 | 500 | 25 | 20.0 | 20 | 250.00 | 0.0% |
| 10 | 4920 | 260 | 492 | 26 | 18.9 | 19 | 258.95 | 0.4% |
| 10 | 5120 | 270 | 512 | 27 | 19.0 | 19 | 269.47 | 0.2% |
| 10 | 5040 | 280 | 504 | 28 | 18.0 | 18 | 280.00 | 0.0% |
| 10 | 4920 | 290 | 492 | 29 | 17.0 | 17 | 289.41 | 0.2% |
| 10 | 5080 | 300 | 508 | 30 | 16.9 | 17 | 298.82 | 0.4% |

FREQUENCY SYNTHESIZER

TECHNICAL FIELD

This relates to a frequency synthesizer and more particularly to a count lock loop (CLL) frequency synthesizer which may be used in devices such as high speed circuits and/or wireless circuits.

BACKGROUND

Electronic circuits often include a system for generating one or more known frequencies. These known frequencies are often related to clock signals. Clock signals may be generated using oscillator circuits and/or a frequency synthesizer. An oscillator circuit is typically capable of generating a single clock signal. But frequency synthesizers are typically capable of generating multiple clock signals using a single reference signal. The reference signal may be generated by an oscillator circuit. A typical frequency synthesizer circuit may utilize a phase-locked loop (PLL) circuit. PLL circuits include a feedback loop. The loop filter of the PLL occupies a relatively large area and the loop may suffer from stability issues with $2^{nd}$ or higher order closed loops. In addition, analog blocks present in typical frequency synthesizer circuits, such as voltage controlled oscillators (VCO) and/or digitally controlled oscillators (DCO), may be sensitive to particular processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure, in various embodiments, provides a novel frequency synthesizer that may address one or more disadvantages of existing frequency synthesizers. In some embodiments, the frequency synthesizer may be an all digital count lock loop (CLL) frequency synthesizer which may be used in devices such as high speed circuits and/or wireless circuits. In some embodiments, the frequency synthesizer may use a feed forward approach for frequency lock.

Figure 1:
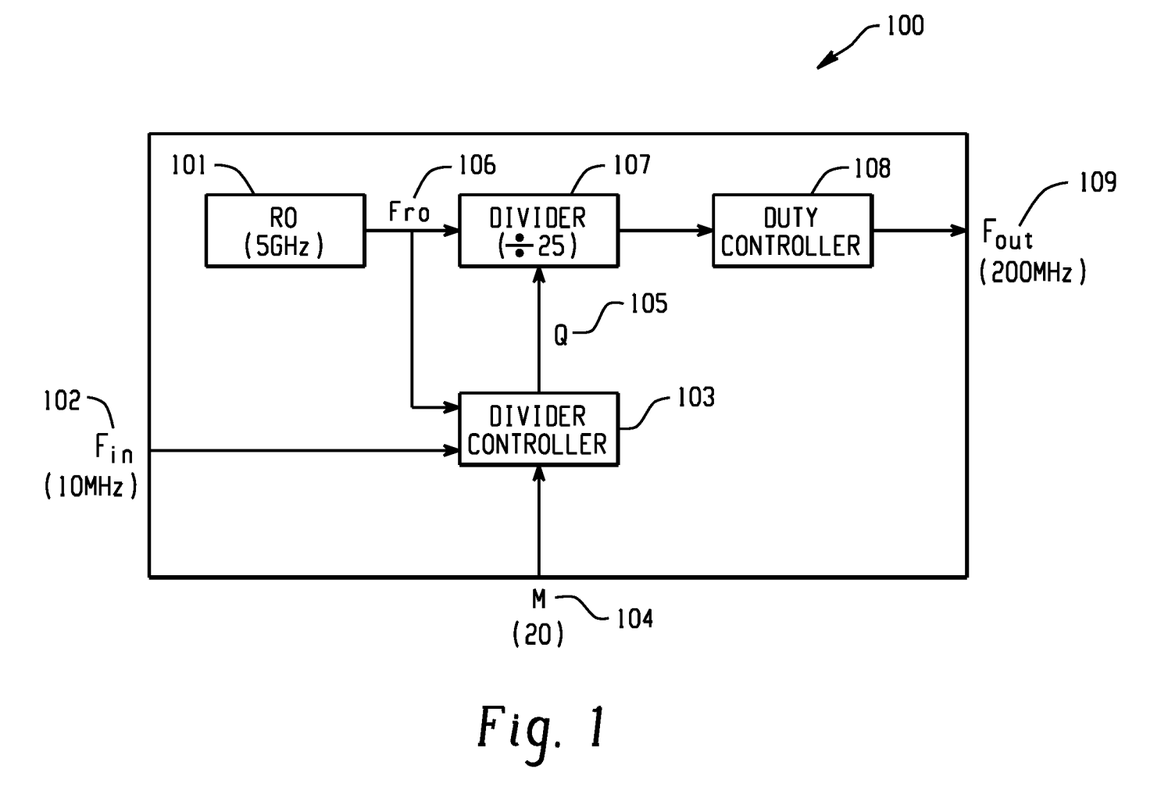
FIG. 1 is a schematic drawing of an example of frequency synthesizer, in accordance with some embodiments.

FIG. 1 is a schematic drawing of an example of frequency synthesizer in accordance with some embodiments. In certain embodiments, the frequency synthesizer 100 illustrated in FIG. 1 may be a standalone circuit and/or may be incorporated into a larger circuit. In some embodiments, the frequency synthesizer 100 may be implemented as an integrated circuit device. The frequency synthesizer 100 includes a reference oscillator (RO) 101 for generating a clock signal with a known frequency. In the example illustrated in FIG. 1, the reference oscillator 101 generates a clock signal 106 with a frequency ($F_{RO}$) of 5 GHZ. In some embodiments, the reference oscillator may generate a clock signal 106 with a frequency of 10 MHz, 100 MHz, 250 MHZ, 500 MHZ, 1 GHz, 2 GHZ, 2.5 GHz, 5 GHZ, or another suitable frequency. The output frequency of the clock signal generated by the reference oscillator 101 is illustrated as clock signal 106 with frequency ($F_{RO}$). The frequency synthesizer 100 also includes another input clock signal 102 with frequency ($F_{IN}$). The frequency of the input clock signal 102 is also a known frequency. In the example illustrated in FIG. 1, the frequency of the input clock signal 102 is 10 MHz. Other frequencies may also be used.

The reference oscillator clock signal 106 and the clock signal 102 are input to the divider controller 103. Along with the two clock inputs 106 and 102, the divider controller 103 also receives a third input referred to as a multiplier (M) 104. In the example illustrated in FIG. 1, the value of the multiplier 104 is 20. In some embodiments, other multiplier values may also be selected. The output of the divider controller 103 is an integer value (Q) 105. As explained in more detail below, the value of Q may be determined using the following relationship:

$$Q=N/M, \text{ where } N=F_{RO}/F_{IN}.$$

Accordingly, in the example illustrated in FIG. 1, the value of Q is (5 GHz/10 MHz)/20=25. The divider 107 receives the clock signal from the reference oscillator 106 and the integer value Q and outputs a frequency signal that is equal to $F_{RO}/Q$. As discussed in more detail below, the duty controller 108 controls the duty cycle of the frequency signal output by the divider 107 and outputs an output clock signal 109 with a frequency ($F_{OUT}$). As illustrated in the example of FIG. 1, the frequency of the output clock signal 109 is 200 MHZ.

As illustrated in FIG. 1, the frequency synthesizer 100 includes a feed forward loop from input clock signal 106 to divider controller 103 and then to the divider 107. As discussed above, the feed forward loop aides with providing the divider 107 with the Q value. In some embodiments, the frequency of the input clock signal 106 may be preselected during circuit design and it may be possible to generate a desired output clock signal 109 during operation by adjusting the frequency of input clock signal 102 and the multiplier value 104. In some embodiments, the frequency of the input clock signal 106 and the frequency of the input clock signal 102 may be preselected during circuit design and it may be possible to generate an output clock signal 109 with a desired frequency during operation by adjusting the multiplier value 104. In exemplary embodiments, the frequency of the output clock signal 109 may be calculated using the following relationship:

$$F_{OUT}=F_{IN}*M.$$

Figure 2:
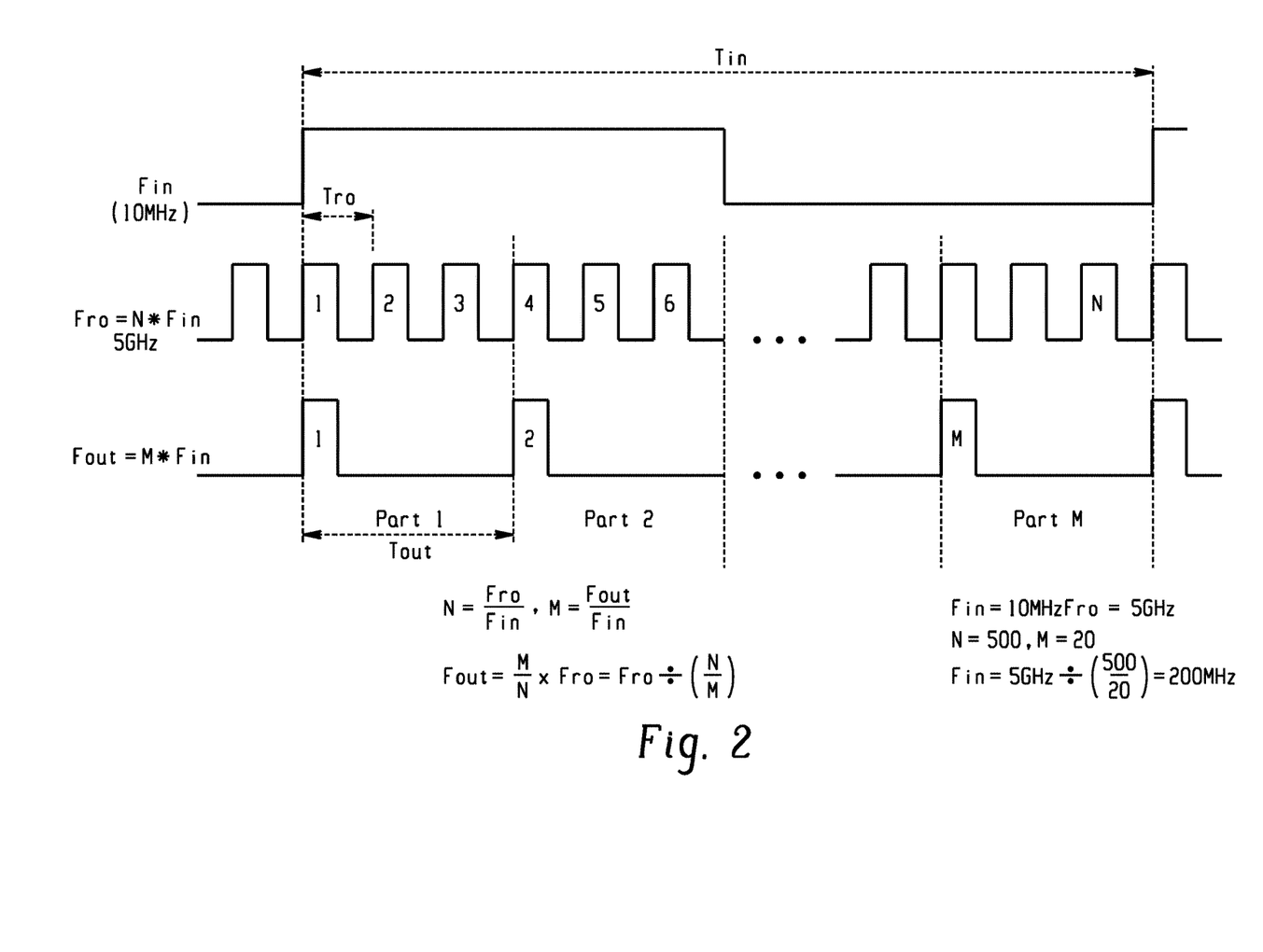
FIG. 2 is a timing diagram illustrating the operation of the frequency synthesizer of FIG. 1, in accordance with some embodiments.

FIG. 2 is a timing diagram illustrating the operation of the frequency synthesizer 100 of FIG. 1 in accordance with some embodiments. As illustrated in FIG. 2, assuming an input clock signal (Fin) with a frequency of 10 MHz, the value N may be calculated by counting the number of cycles of the input (reference) clock signal (Fro) during one cycle of the input clock signal (Fin). In the example shown in FIG. 2 (and FIG. 1), the frequency of the input clock signal 102 is Fin=10 MHz and frequency of the input (reference) clock signal is Fro=5 GHz. Accordingly, N is equal to 500. The frequency of the output signal (Fout) is generated by generating one pulse for every N/M cycles of the input (reference) clock signal (Fro). In the example illustrated in FIG. 2, M is equal to 20 so a total of 25 pulses are generated during the single cycle of the input clock signal (Fin). The frequency of the pulses corresponds to the desired output frequency of the output clock signal (Fout) of the frequency synthesizer 100. In the example illustrated in FIG. 2, the output frequency is 200 MHz.

Figure 3:
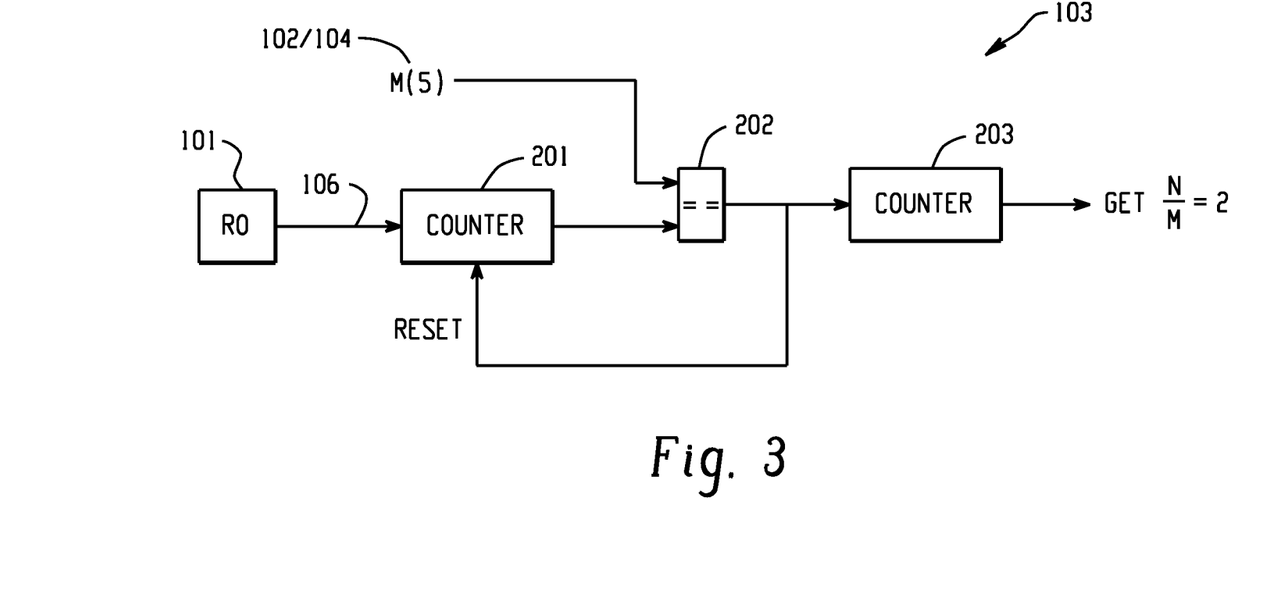
FIG. 3 is a schematic diagram of an example of a divider controller, in accordance with some embodiments.
Figure 4:
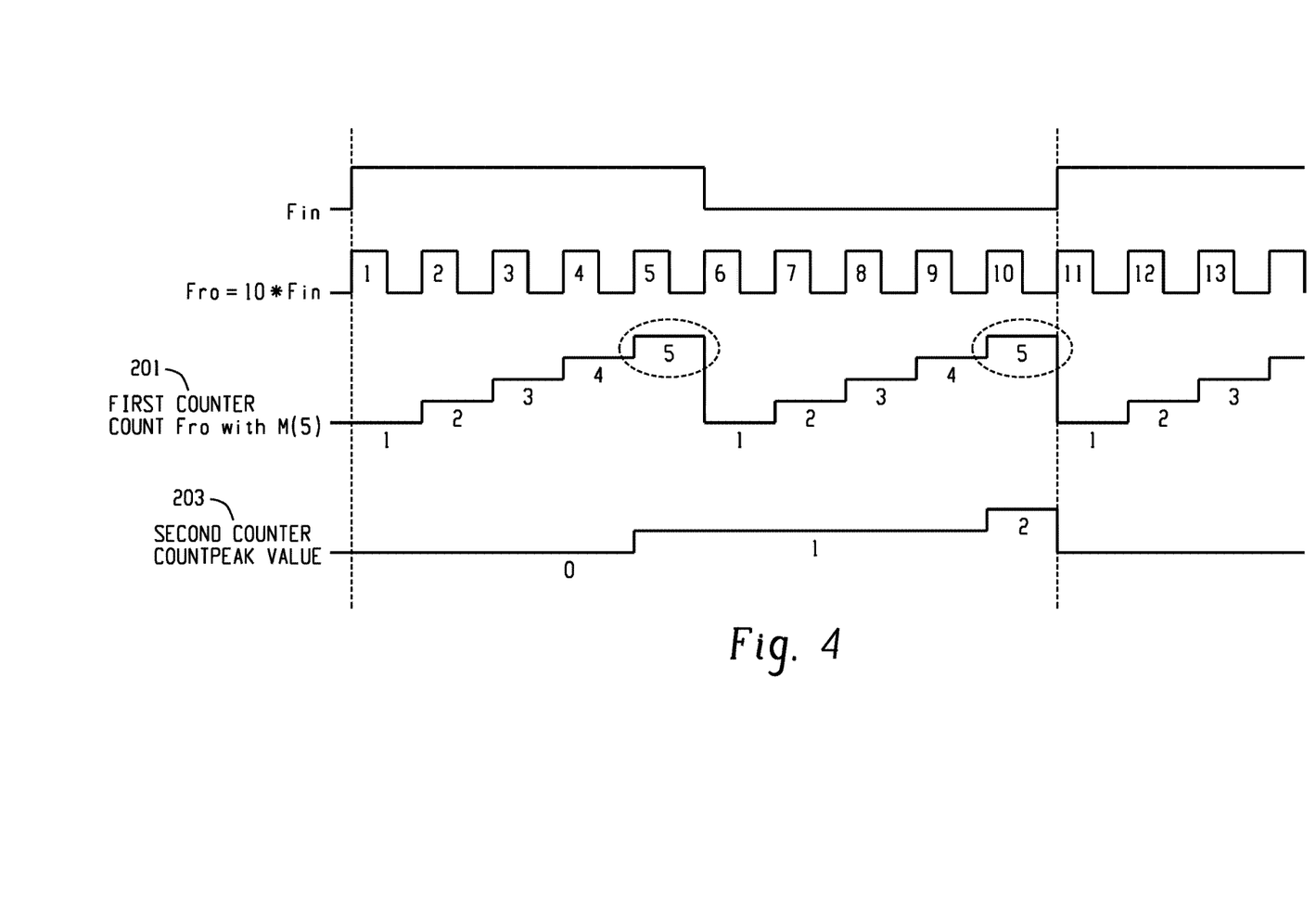
FIG. 4 is a timing diagram illustrating the operation of the divider controller of FIG. 3, in accordance with some embodiments.

FIG. 3 is a schematic diagram of an example of a divider controller in accordance with some embodiments. In some embodiments, the divider controller 103 illustrated in FIG. 3 may be implemented as part of the frequency synthesizer 100 illustrated in FIG. 1 (e.g., at 103). FIG. 4 is a timing diagram illustrating the operation of the divider controller 103 of FIG. 3 in accordance with some embodiments. FIG. 4 is described together with FIG. 3 to aid in the understanding of the divider controller 103. In some embodiments, the divider controller 103 is configured to obtain the value of N which is the ratio of the frequency of the reference oscillator input clock signal 106 and the input clock signal 102. The value of N is then divided by the multiplier value 104 to obtain the output (Q) of the divider controller 105. In FIG. 3 and FIG. 4, the frequency of the input signal 106 is 10 times (Fro=10*Fin) that of the frequency of the input signal 102 and the multiplier value (M) is 5. These values aid with illustrating the operation of divider controller and should not be considered as limiting features of the described embodiments. For example, in FIG. 1, the frequency of the input clock signal 106 was 500 times that of the frequency of the input clock signal 102 and the multiplier value (M) was 20.

As illustrated in FIG. 3, the divider controller 103 includes a first counter 201 a comparison circuit (e.g., performing a==function) 202, and a second counter 203. The first counter 201 receives the first (reference) clock signal 106 from the reference oscillator 101 as an input. As illustrated in FIG. 4, the frequency of the input clock signal 106 has a frequency that is multiple of the frequency of the input clock signal 102. In the example illustrated in FIG. 3 and FIG. 4, the frequency of the input clock signal is 10 times the frequency of the input clock signal 102. Accordingly, as illustrated, the input clock signal 106 cycles 10 times in the same amount of time that the input clock signal 102 cycles one time. As discussed above, the ratio of these frequencies corresponds to the value of variable (N). Each time the input (reference) clock signal 106 cycles, the first counter 201 increments an internal count value and outputs the count value to the comparison circuit 202. In the example illustrated in FIG. 4, the first counter 201 increments on the leading edge of each cycle of the input clock signal 106. In some embodiments, the first counter 201 may increment on the falling edge of the input clock signal 106 or some other metric associated with the input clock signal 106.

The comparison circuit 202 receives the output of the first counter and the multiplier 104. In this case, the multiplier value is 5 (M(5)). The comparison circuit 202 is configured to determine when the multiplier 104 and the first counter value are equal to one another. Accordingly, once the value of the first counter reaches 5, the output of the comparison circuit switches (e.g., from a low value to a high value). When the output of the comparison circuit 202 switches, the value within the first counter 201 is reset via a feedback loop. Additionally, the value within the second counter 203 is incremented. Turning again to FIG. 4, the resulting timing diagram illustrates the value of the second counter 203 incrementing at the leading edge of the first counter 201. Accordingly, each time the first counter 201 reaches a value of 5, the second counter increments by 1. In the example illustrated in FIG. 3 and FIG. 4, the second counter 202 outputs a value of 2 at the end of each cycle of the input clock signal. Accordingly, the value of the output Q is 2. As discussed with respect to FIG. 1, Q is the ratio of N to M which, in the case of FIG. 4, is the ratio of 10 to 5 or 2.

Figure 5:
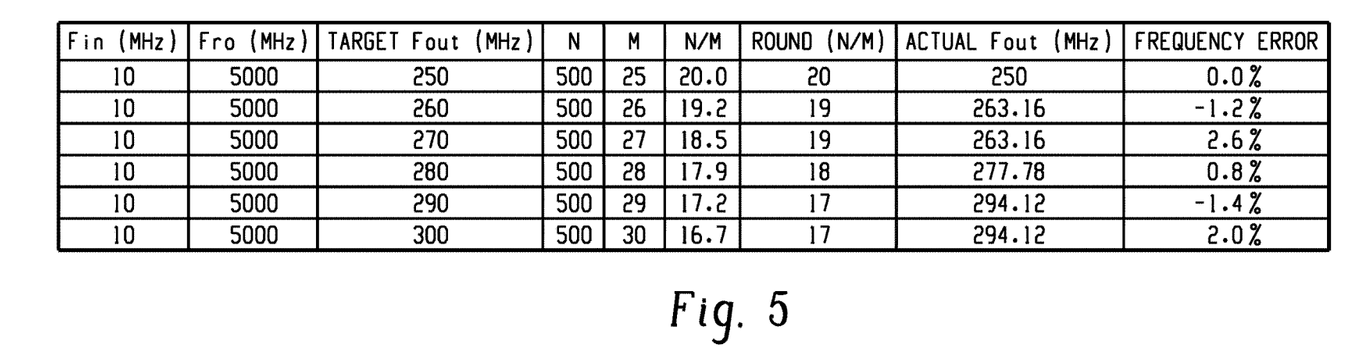
FIG. 5 is an exemplary table describing the operation of the frequency synthesizer of FIG. 1 at different output frequencies, in accordance with some embodiments.

FIG. 5 is an exemplary table describing the operation of the frequency synthesizer 100 of FIG. 1 at different output frequencies in accordance with some embodiments. As illustrated in FIG. 5, it may be desirable for the frequency synthesizer to generate different output frequencies 109. In FIG. 5, the exemplary target output frequencies include 250, 260 270, 280, 290, and 300 MHz. The frequency of the input clock signal 102 is fixed at 10 MHz and the frequency of input clock signal 106 is fixed at 5 GHz (or 5000 MHz as shown in FIG. 5). As a result, the value of N is 500 for each of the target output frequencies. As discussed above, the output frequency is determined as the product of the frequency of the input clock signal 102 and the multiplier 104. The desired Q value can be calculated by dividing N by M. As seen in the table in FIG. 5, the Q values (shown as N/M in FIG. 5) are not always integer values. In some cases, the Q value desired to generate the target frequency of the output clock signal 109 may be a complex value. As discussed above with respect to FIG. 3 and FIG. 4, the divider controller circuit generates the Q value using a first and a second counter. In this case, the circuit design generates integer values. Accordingly, it may be necessary for the divider controller to round the Q value to the closest integer value prior to being output. However, since the output frequency 109 is determined by dividing the reference frequency by the Q value, an error is introduced as a result of the rounding operation. This potential error value is illustrated in the last column of the table in FIG. 5. In some embodiments, error reduction operations are performed to provide a better match for a target output frequency.

Figure 6:
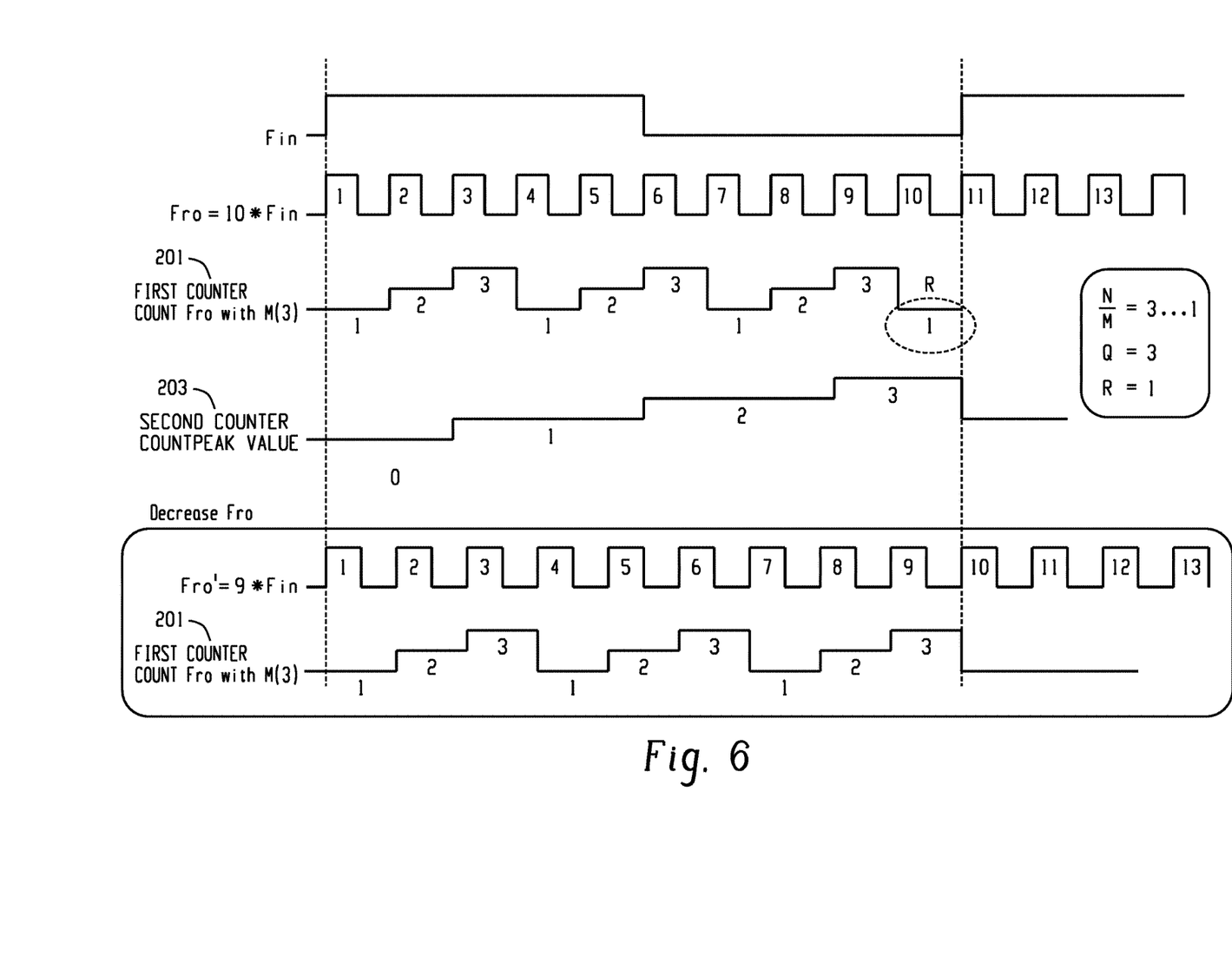
FIG. 6 is a timing diagram illustrating a first error reduction operation of the divider controller of FIG. 3, in accordance with some embodiments.
Figure 7:
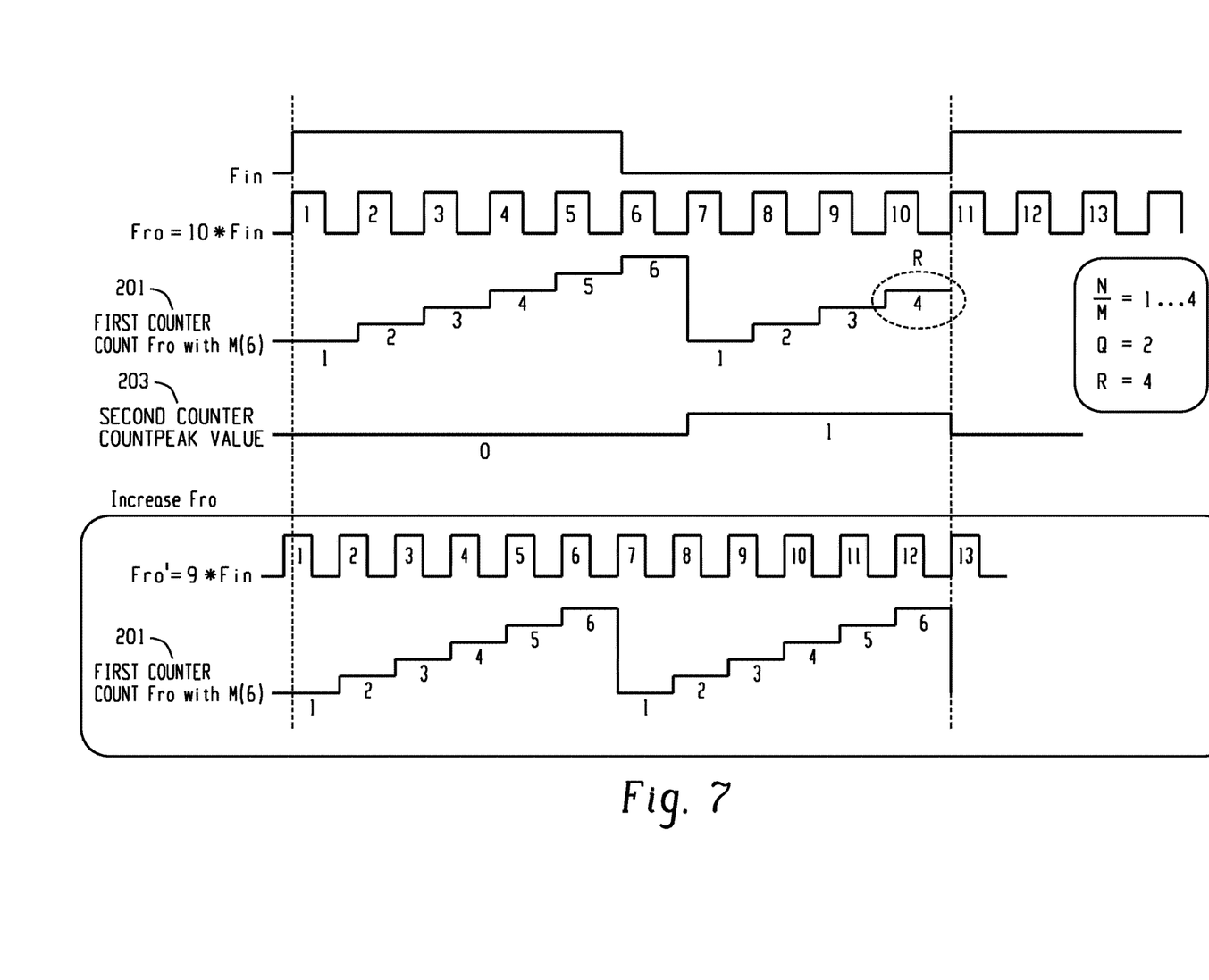
FIG. 7 is a timing diagram illustrating a second error reduction operation of the divider controller of FIG. 3, in accordance with some embodiments.

FIG. 6 is a timing diagram illustrating a first error reduction operation of the divider controller of FIG. 3 in accordance with some embodiments. FIG. 7 is a timing diagram illustrating a second error reduction operation of the divider controller of FIG. 3 in accordance with some embodiments. The error reduction operation illustrated in FIG. 6 and FIG. 7 is nearly the same operation, except in FIG. 6, the frequency of the input (reference) clock signal 106 is decreased to reduce the output frequency error, and in FIG. 7, the reference voltage is increased to reduce the output frequency error.

As illustrated in FIG. 6, the frequency of the input (reference) clock signal 106 is 10 times the input frequency and the multiplier value is 3. As a result, after 10 cycles of the input clock signal 106, the first counter 201 has a remainder value R of 1. In some embodiments, the remainder value may be less than or more than half of the multiplier value 104. In accordance with some embodiments described herein, if the value of R is less than half of the multiplier value 104 (as illustrated in FIG. 6), the frequency of the input clock signal 106 is decreased. In some embodiments, the frequency of the input clock signal 106 may be decreased to a value that results in a remainder value R of 0. In the example illustrated in FIG. 6, the frequency of the input (reference) clock signal 106 may be decreased to nine (9) times the frequency of input clock signal 102 to reduce the remainder value R to 0. In this manner, the first counter value does not include a remainder value R.

As illustrated in FIG. 7, the frequency of the input (reference) clock signal 106 is 10 times the frequency of input clock signal 102 and the multiplier value is 6. As a result, after 10 cycles of the reference voltage, the first counter 201 has a remainder value R of 4. As discussed above with respect to FIG. 6, since the value of R is more than half of the multiplier value 104, the frequency of the input (reference) clock signal 106 is increased until the remainder value R is reduced to 0. In the example illustrated in FIG. 7, the frequency of the input (reference) clock signal 106 is increased to twelve (12) times the frequency of the input clock signal 102 so the remainder value R is 0. In this manner, the first counter value does not include a remainder value R.

Figure 8:
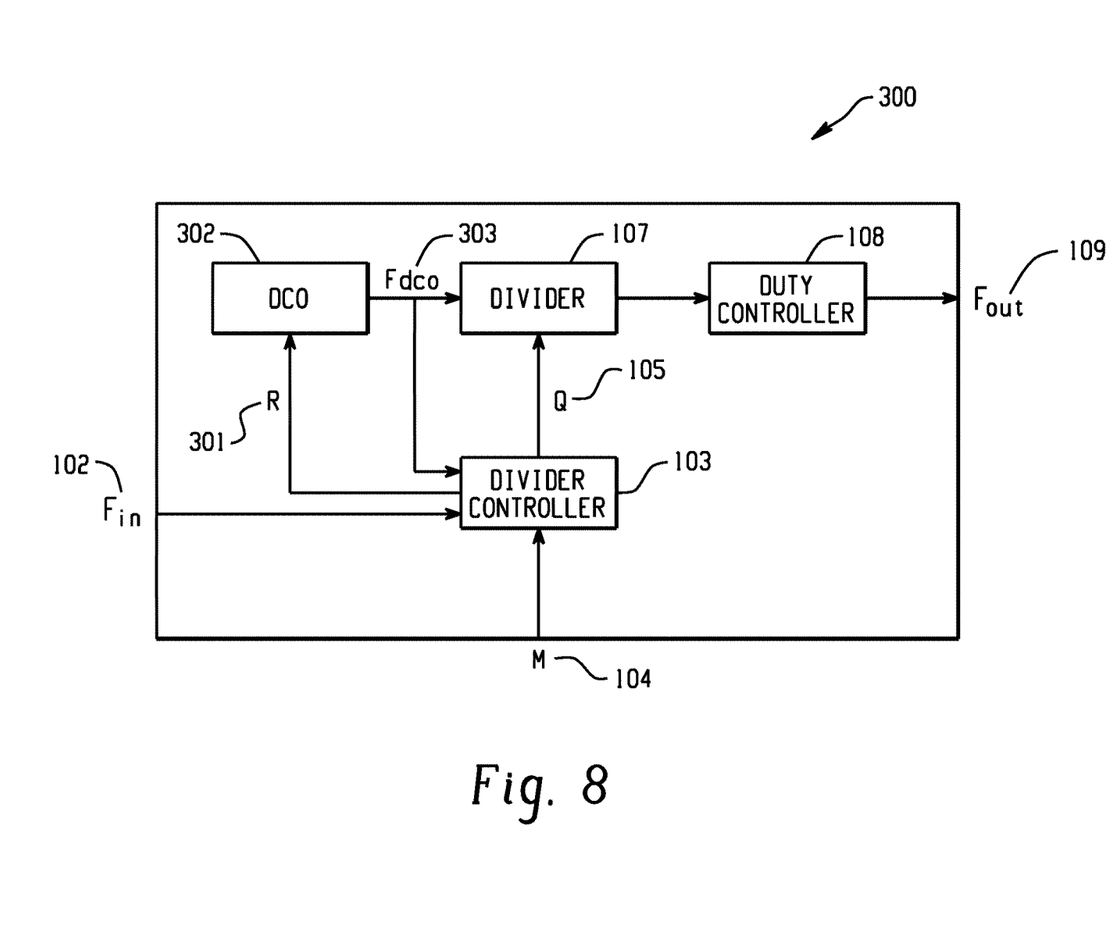
FIG. 8 is a schematic drawing of a second example of frequency synthesizer, in accordance with some embodiments.

FIG. 8 is a schematic drawing of a second example of a frequency synthesizer in accordance with some embodiments. As illustrated, the frequency synthesizer 300 in FIG. 8 is similar to the frequency synthesizer 100 illustrated in FIG. 1. The frequency synthesizer 300 differs from the embodiment illustrated in FIG. 1 because it includes a digitally controlled oscillator 302 which generates a digitally controlled input clock signal 303 with a frequency ($F_{DCO}$). In addition, the Divider controller 103 generates a remainder value (R) 301 and communicates the remainder value 301 (or similar error information) to the digitally controlled oscillator 302. In operation, the remainder value 301 is used by the digitally controlled oscillator 302 to adjust the frequency of the digitally controlled input clock signal 303 to reduce the error of the frequency of the output clock signal 109. In some embodiments, the digitally controlled oscillator 302 may be configured to increase and/or decrease the frequency of the digitally controlled input clock signal 303 in a predetermined value (e.g., 10 MHz, 20 MHz, 30 MHz, 40 MHz, 50 MHz, etc.) referred to as the gain ($K_{DCO}$).

Figure 9:
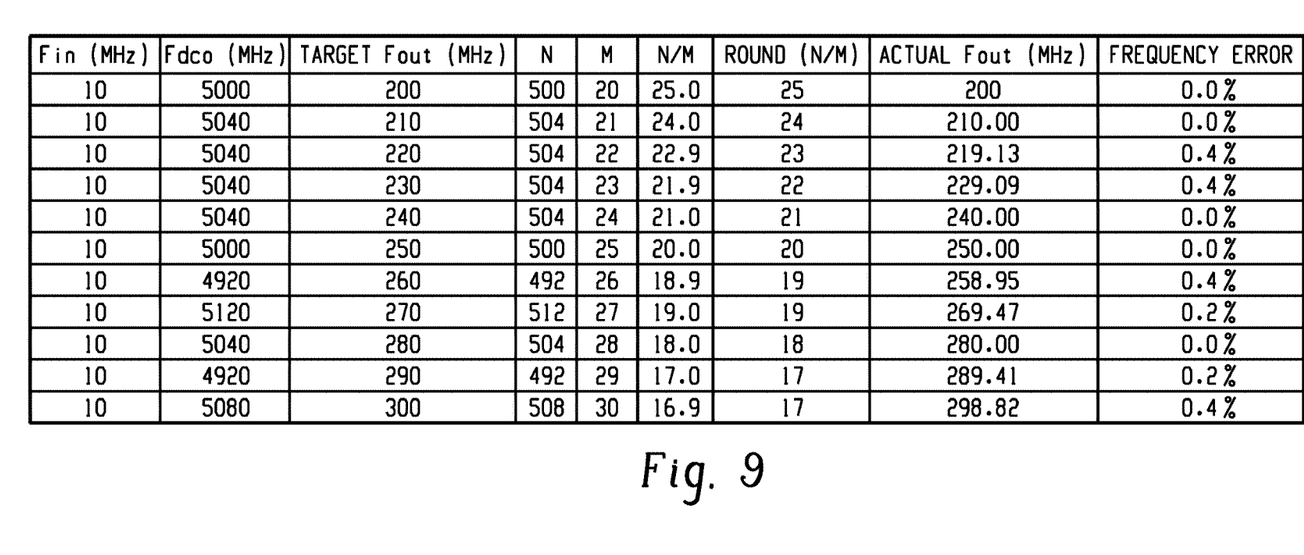
FIG. 9 is an exemplary table describing the operation of the frequency synthesizer of FIG. 8 at different output frequencies, in accordance with some embodiments.

FIG. 9 is an exemplary table describing the operation of the frequency synthesizer of FIG. 8 at different output frequencies in accordance with some embodiments. In FIG. 9, the frequency of the input clock signal 102 is fixed at 10 MHz and the desired output frequency varies from 200 MHz to 300 MHz in increments of 10 MHz. The initial frequency of the digitally controlled input clock signal 303 for each target output frequency is 5 GHz. However, using the feedback described with respect to FIG. 8 including the value of the remainder 301, the frequency of the digitally controlled input clock signal 303 is adjusted up or down. As illustrated in FIG. 9, the adjusted digitally controlled frequency is adjusted in increments of 20 MHz. Generally speaking, the frequency error is given by $K_{DCO} \div [\text{round}(N/M)]$. Accordingly, the larger N/M is, the smaller the frequency error will be and the smaller $K_{DCO}$ is, the smaller the frequency error will be.

To illustrate the benefit of the feedback illustrated in FIG. 8, a comparison of FIG. 5 and FIG. 9 is described herein. For example, with respect to the target output frequency of 300 MHz in FIG. 5, the frequency error is about 2%. This is because the frequency of the input clock signal 106 is fixed at 5 GHz and the multiplier 104 is set at a value of 30. Accordingly, the actual output frequency is not the same as the target output frequency. However, with respect to FIG. 9, the frequency of the digitally controlled input clock signal 303 is adjusted higher by 80 MHz (4*$K_{DCO}$) to 5080 MHz. This adjustment brings the actual Q value closer to the rounded Q value of 17. Since less adjustment of Q is performed (i.e., there is less rounding error), the actual output frequency is closer to the desired output frequency of the output clock signal 109 and the error between the actual and target output frequencies is reduced.

In exemplary embodiments, the maximum frequency error of the frequency synthesizer 300 may be determined by the following relationship:

$$\text{Error} = K_{DCO}/Q$$

As discussed above with respect to FIG. 2, the output of the divider 107 is a series of pulses at a frequency equal to the output frequency. In some embodiments, the duty controller 108 is configured to adjust the duty cycle of this signal to the desired level. For example, in some embodiments, it may be desirable for the output frequency 109 to have a duty cycle of 50% or about 50% (e.g., 45-55%). To accomplish this, the duty controller 108 extends the high level of the divider output until half of the period of the output clock signal 109. In some embodiments, the duty controller 108 may compare the digitally controlled input clock signal and the output of the divider 107. If the value of Q is even, the duty controller 108 may keep the output frequency of the output clock signal at a high level until the rising edge of the 0.5*Q+1 pulse. If the value of Q is odd, the duty controller 108 may keep the output frequency of the output clock signal at a high level until the falling edge of the 0.5*Q pulse.

Figure 10:
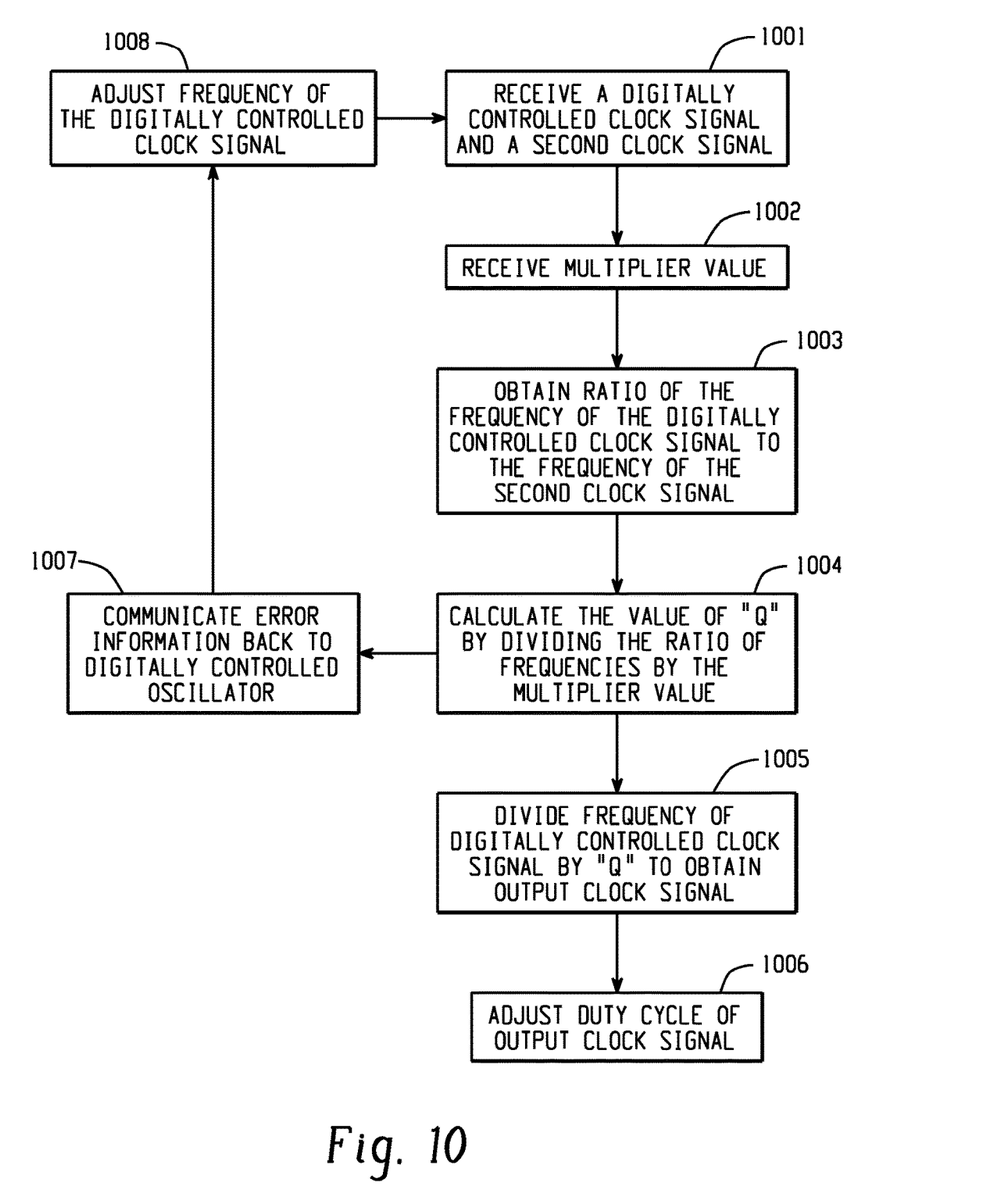
FIG. 10 is a flow chart illustrating the operation of an example of a frequency synthesizer described herein, in accordance with some embodiments.

FIG. 10 is a flow chart illustrating the operation of an example of a frequency synthesizer described herein in accordance with some embodiments. For ease of understanding, the operations of FIG. 10 are described relative to structures illustrated in FIG. 8. But, the operations of FIG. 10 are equally applicable to other structures as well. As illustrated in FIG. 10, the frequency synthesizer 300 receives a digitally controlled input clock signal 303 from the digitally controlled oscillator 302 and a second input clock signal 102 at operation 1001. In operation 1002, a multiplier value 104 is received by the frequency synthesizer 300 and, more specifically, the divider controller 103. At operation 1003, the divider controller 103 obtains a ratio of the frequency of the digitally controlled input clock signal 303 to the frequency of the second clock signal 102. At operation 1004, the divider controller 103 calculates the value of Q by dividing the ratio by the multiplier M. At step 1005, the frequency of the digitally controlled clock signal 106 is divided by the Q value to obtain an output clock signal with a desired output frequency or a frequency close to the desired output frequency. At operation 1006, a duty controller 108 adjusts the duty cycle of the output clock signal to a desired duty cycle (e.g., 50%). As further illustrated in FIG. 10, the divider controller 103 also communicates error information (R) back to the digitally controlled oscillator 302, at operation 1007. The digitally controlled oscillator 302 adjusts the frequency of the digitally controlled input clock signal 303 at operation 1008. The adjusted clock signal replaces the previous digitally controlled clock signal.

In some embodiments, the frequency synthesizer described herein may benefit from more of more of the following advantages. In some embodiments, the frequency synthesizer may not include a loop filter which may reduce the area occupied by the frequency synthesizer. In some embodiments, the frequency synthesizer may not suffer from the instability issues associated with $2^{nd}$ order closed loops since the frequency synthesizer may not include a feedback loop or may only have a first order feedback loop. In some embodiments, the frequency synthesizer may be more easily implemented with standard cell designs since the frequency synthesizer is an all digital design—i.e., in some embodiments, the frequency synthesizer may not include any analog components.

Embodiments described herein may provide a frequency synthesizer comprising a reference oscillator configured to generate a first clock signal with a reference frequency and a divider controller configured to receive the first clock signal, a second clock signal, and a multiplier value. The divider controller is configured to obtain a ratio of a frequency of the first clock signal to a frequency of the second clock signal and divide the resulting ratio by the multiplier value to obtain controller output value. A divider is configured to receive the first clock signal and controller output value and output an output clock signal with a frequency equal to the frequency of the first clock signal divided by the controller output value.

Embodiments described herein may provide an all digital frequency synthesizer comprising a reference oscillator configured to generate a first clock signal with a reference frequency and a divider controller comprising a first counter circuit, a comparison circuit and a second counter circuit. The divider controller may be configured to receive the first clock signal, a second clock signal, and a multiplier value, and may be configured to obtain a ratio of a frequency of the first clock signal to a frequency of the second clock signal and divide the resulting ratio by the multiplier value to obtain a controller output value. A divider configured to receive the first clock signal and the controller output value and output an output clock signal with a frequency equal to the frequency of the first clock signal divided by the controller output value may also be provided. A feedback loop configured to communicate error information from the divider controller to the reference oscillator to enable the reference oscillator to adjust the frequency of the first clock signal and reduce the frequency error between the actual frequency of the output clock signal and a desired frequency of the output clock signal may be provided.

Embodiments described herein may provide for a method for generating an output clock signal that includes receiving a first clock signal and a second clock signal; receiving a multiplier value; and obtaining a ratio of the frequency of the first clock signal to the frequency of the second clock signal. The method may further comprise calculating a controller output by dividing the resulting ratio by the multiplier value; and dividing the frequency of the first clock signal by the controller output value to obtain an output clock signal.

In certain embodiments, the frequency synthesizer may further comprise a duty controller configured to obtain the output clock signal and adjust the duty cycle of the output clock signal. In certain embodiments, the duty controller may be configured to adjust the duty cycle of the output clock signal to 50%. In certain embodiments, the frequency synthesizer may be implemented using only digital circuit components. In certain embodiments, the multiplier value may be selected such that the product of the multiplier value and the frequency of the second input clock signal is equal to the frequency of the output clock signal. In certain embodiments, the output of the divider controller may be an integer value. In certain embodiments, the divider controller may comprise a first counter circuit, a comparison circuit, and a second counter circuit. In certain embodiments, the divider controller may be configured to communicate error information to the reference oscillator in a feedback loop to enable the reference oscillator to adjust the frequency of the first clock signal and reduce the frequency error between the actual frequency of the output clock signal and a desired frequency of the output clock signal. In certain embodiments, the reference oscillator may be a digitally controller oscillator. In certain embodiments, the digitally controlled oscillator may be configured to adjust the frequency of the first clock signal in predetermined frequency increments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A frequency synthesizer comprising:
   a reference oscillator configured to generate a first clock signal with a reference frequency;
   a divider controller configured to receive the first clock signal, a second clock signal, and a multiplier value, the divider controller configured to obtain a ratio of a frequency of the first clock signal to a frequency of the second clock signal and divide the resulting ratio by the multiplier value to obtain a controller output value; and
   a divider configured to receive the first clock signal and the controller output value and output an output clock signal with a frequency equal to the frequency of the first clock signal divided by the controller output value.

2. The frequency synthesizer of claim 1, wherein the divider controller is configured to communicate error information to the reference oscillator in a feedback loop to enable the reference oscillator to adjust the frequency of the first clock signal.

3. The frequency synthesizer of claim 2, wherein the reference oscillator is a digitally controller oscillator.

4. The frequency synthesizer of claim 3, wherein the digitally controlled oscillator is configured to adjust the frequency of the first clock signal in a predetermined frequency value.

5. The frequency synthesizer of claim 1, further comprising a duty controller configured to obtain the output clock signal and adjust the duty cycle of the output clock signal.

6. The frequency synthesizer of claim 5, wherein the duty controller is configured to adjust the duty cycle of the output clock signal to about 50%.

7. The frequency synthesizer of claim 1, wherein the frequency synthesizer is implemented without using a feedback loop.

8. The frequency synthesizer of claim 1, wherein the multiplier value is selected such that the product of the multiplier value with the frequency of the second input clock signal is equal to the frequency of the output clock signal.

9. The frequency synthesizer of claim 1, wherein the output of the divider controller is an integer value.

10. The frequency synthesizer of claim 1, wherein the divider controller comprises a first counter circuit, a comparison circuit, and a second counter circuit.

11. A method for generating an output clock signal, the method comprising:
   receiving a first clock signal and a second clock signal;
   receiving a multiplier value;
   obtaining a ratio of the frequency of the first clock signal to the frequency of the second clock signal;
   calculating a controller output by dividing the resulting ratio by the multiplier value; and
   dividing the frequency of the first clock signal by the controller output value to obtain an output clock signal.

12. The method of claim 11, further comprising:
   communicating error information to the reference oscillator in a feedback loop; and
   adjusting the frequency of the first clock signal in response to the error information.

13. The method of claim 12, wherein the digitally controlled oscillator is configured to adjust the frequency of the first clock signal in a predetermined frequency value.

14. The method of claim 11, further comprising adjusting the duty cycle of the output clock signal.

15. The method of claim 14, wherein the duty cycle of the output clock signal is adjusted to about 50%.

16. The method of claim 11, wherein the method is implemented without using a feedback loop.

17. The method of claim 11, wherein the multiplier value is selected such that the product of the multiplier value with the frequency of the second input clock signal is equal to the frequency of the output clock signal.

18. The method of claim 11, wherein the output of the divider controller is an integer value.

19. A frequency synthesizer comprising:
   a reference oscillator configured to generate a first clock signal with a reference frequency;
   a divider controller comprising a first counter circuit, a comparison circuit and a second counter circuit, the divider controller configured to receive the first clock signal, a second clock signal, and a multiplier value, the divider controller configured to obtain a ratio of a frequency of the first clock signal to a frequency of the second clock signal and divide the resulting ratio by the multiplier value to obtain a controller output value;
   a divider configured to receive the first clock signal and the controller output value and output an output clock signal with a frequency equal to the frequency of the first clock signal divided by the controller output value; and
   a feedback loop configured to communicate error information from the divider controller to the reference oscillator to enable the reference oscillator to adjust the frequency of the first clock signal and reduce the frequency error between the actual frequency of the output clock signal and a desired frequency of the output clock signal.

20. The frequency synthesizer of claim 1, further comprising a duty controller configured to obtain the output clock signal and adjust the duty cycle of the output clock signal to about 50%.

* * * * *